United States Patent [19]
Yamazaki

[11] Patent Number: 5,523,606
[45] Date of Patent: Jun. 4, 1996

[54] BICMOS SEMICONDUCTOR DEVICE HAVING SIGE HETEROJUNCTION AND SI HOMO-JUNCTION TRANSISTORS

[75] Inventor: Toru Yamazaki, Tokyo, Japan

[73] Assignee: NEC Corporation, Tokyo, Japan

[21] Appl. No.: 319,845

[22] Filed: Oct. 7, 1994

[30] Foreign Application Priority Data

Oct. 7, 1993 [JP] Japan ................... 5-251253

[51] Int. Cl.[6] .................. H01L 29/94; H01L 31/072; H01L 31/0328
[52] U.S. Cl. .................. 257/370; 257/197; 257/378; 257/553; 257/555; 257/616
[58] Field of Search .................. 257/197, 198, 257/370, 553, 555, 378, 616

[56] References Cited

U.S. PATENT DOCUMENTS

| | | | |
|---|---|---|---|
| 5,268,588 | 12/1993 | Marum | 257/362 |
| 5,323,031 | 6/1994 | Shoji et al. | 257/197 |
| 5,399,894 | 3/1995 | Maeda et al. | 257/370 |

FOREIGN PATENT DOCUMENTS

| | | |
|---|---|---|
| 1-289163 | 11/1989 | Japan . |
| 2-106937 | 4/1990 | Japan . |

OTHER PUBLICATIONS

Imai, K., et al.; "A Cyro –BiCMOS Technology with Si/SiGe Heterojunction Bipolar Transistors", IEEE 1990 Bipolar Circuits and Technology Meeting 4.4, pp. 90–93.
By E. Prinz et al., "The effect of Base–Emitter Spacers and Strain–Dependent Densities of States in $Si/SI_{1-x}Ge_x/Si$ Heterojunction Bipolar Transistors", IEEE, 1989, pp. 639–642.
By K. Imai et al., "A Cryo–BiCMOS Technology with Si/SiGe Heterojunction Bipolar Transistors", IEEE 1990 Bipolar Circuits and Technology Meeting, pp. 90–93.

Primary Examiner—Jerome Jackson, Jr.
Assistant Examiner—John Guay
Attorney, Agent, or Firm—Young & Thompson

[57] ABSTRACT

A BiCMOS semiconductor device includes a pair of p-channel and n-channel MOS field effect transistors, a heterojunction bipolar transistor including an epitaxial base layer made of a first compound semiconductor, and a homojunction bipolar transistor including a base layer made of a second semiconductor. The hetero-junction bipolar transistor is operated in a low collector current region less than a critical collector current value at which the hetero-junction bipolar transistor has the maximum value of a cutoff frequency thereof. The homo-junction bipolar transistor is operated in a high collector current region more than a critical collector current value at which the homo-junction bipolar transistor has the maximum value of a cutoff frequency thereof.

8 Claims, 11 Drawing Sheets

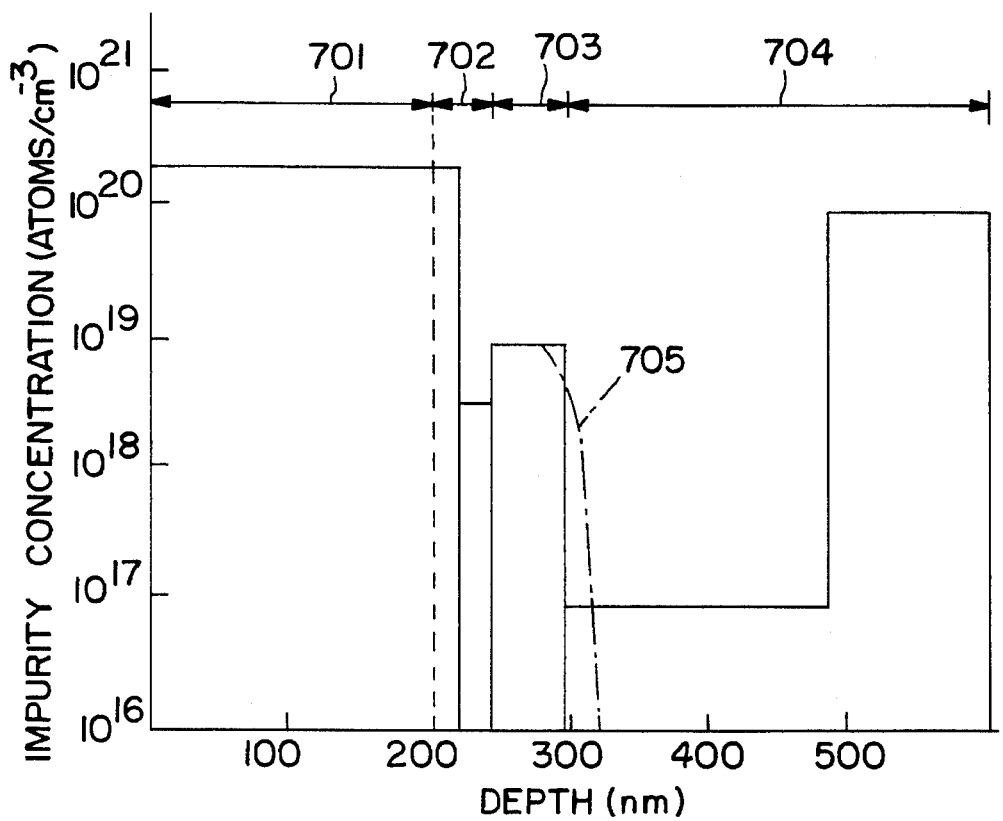
FIG. 2
PRIOR ART
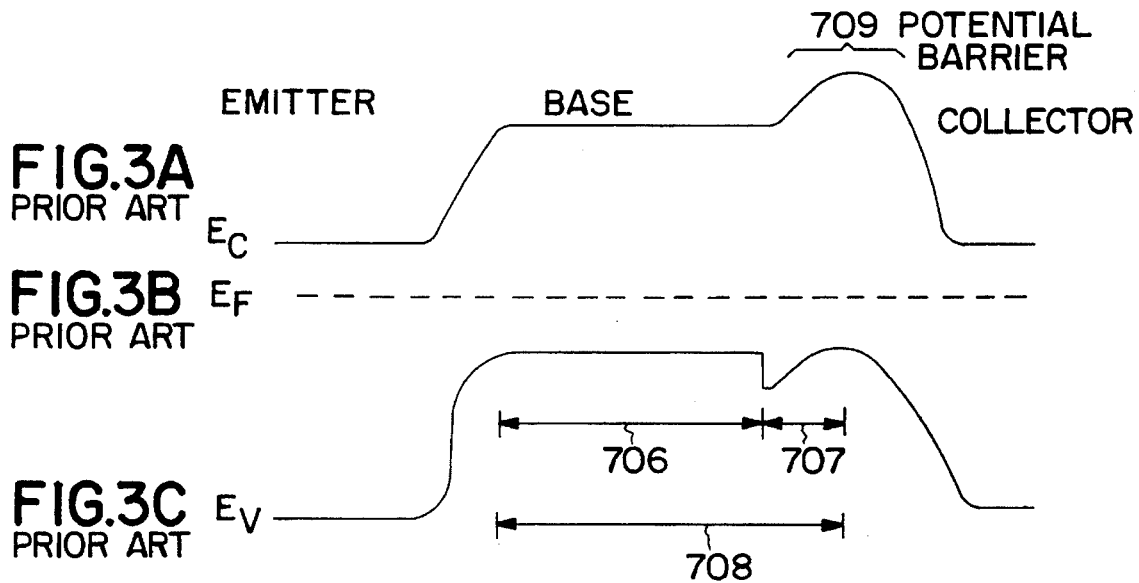
FIG. 3A PRIOR ART $E_C$
FIG. 3B PRIOR ART $E_F$
FIG. 3C PRIOR ART $E_V$

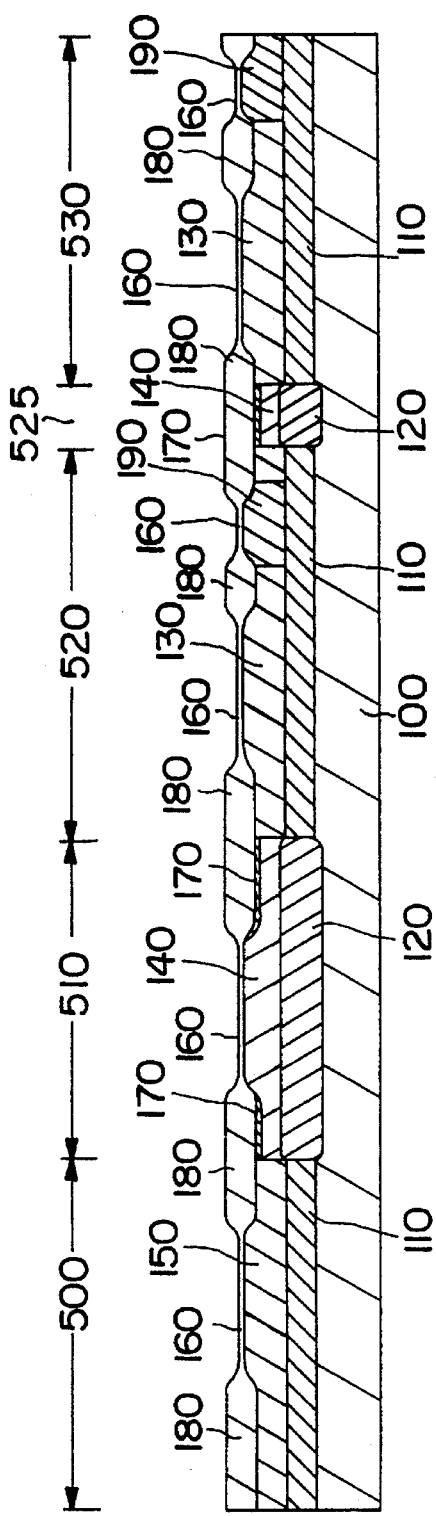
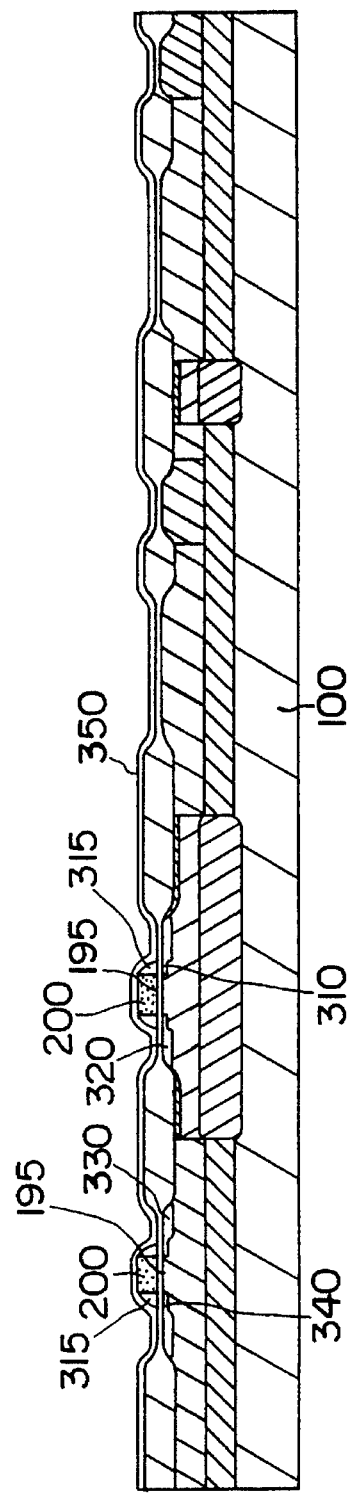
FIG. 7A
FIG. 7B

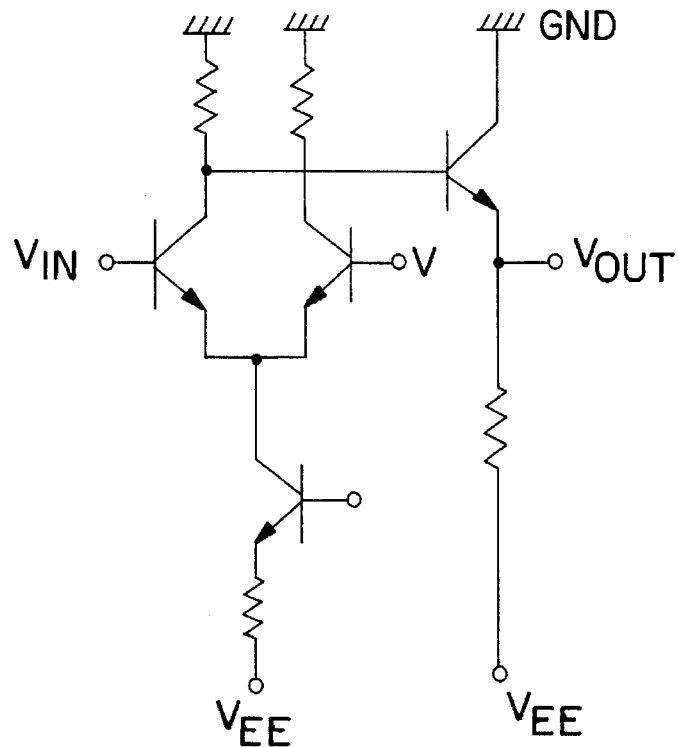
F I G. 10
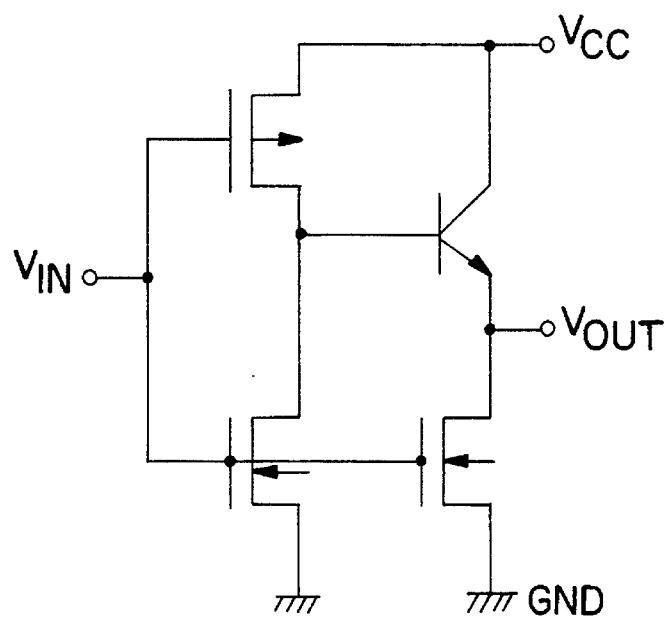
F I G. 11

BICMOS SEMICONDUCTOR DEVICE HAVING SIGE HETEROJUNCTION AND SI HOMO-JUNCTION TRANSISTORS

BACKGROUND OF THE INVENTION

1. Field of the Invention

The invention relates to a BiCMOS semiconductor device, and more particularly to a BiCMOS semiconductor device having an improved high frequency and high speed performance.

2. Description of the Related Art

Scaling down of BiCMOS semiconductor devices has been improved by developments of self alignment techniques and microlithography. The improvement in the scaling down of the BiCMOS semiconductor device has also provided an improvement in a high frequency and high speed performance of the BiCMOS semiconductor device. Further improvement of the high frequency and high speed performance of the BiCMOS semiconductor device however requires a further improvement in performance in speed of a bipolar transistor involved in the BiCMOS semiconductor device. Conventional techniques for improvement in performance in the speed of the bipolar transistor are disclosed in the Japanese laid-open patent applications Nos. 2-106937 and 1-289163 in which the bipolar transistor is made of silicon system materials for improvements in the current gain and for reduction of base resistance. Another conventional technique for applying a Si/SiGe hetero-junction bipolar transistor having a SiGe base layer to the BiCMOS semiconductor device is disclosed by K. Imai et al., 1990 IEEE BCTM, pp. 90–93. The bipolar transistor has a structure as illustrated in FIG. 1. Then, the bipolar transistor has a p-type silicon substrate 601, an n-type buried layer 602, an n-type collector layer 603, isolation regions 604, an n-type collector plug layer 605, a p-type external base layer 606, a p-SiGe base layer 607 formed by molecular beam epitaxy, an n$^-$-Si epitaxial layer 608 formed by molecular beam epitaxy, an n-type emitter layer 609 and an n$^+$-type polysilicon layer 610. The bipolar transistor has an impurity concentration profile in a direction at depth as illustrated in FIG. 2 in which a first region 701 corresponds to the polysilicon layer 610 having an impurity concentration in the range of from $1\times10^{20}$ to $1\times10^{21}$ cm$^{-3}$ and a thickness in the range of from 150 to 250 nanometers. A second region 702 corresponds to the silicon epitaxial layer 608 having an impurity concentration in the range of from $5\times10^{17}$ to $1\times10^{19}$ cm$^{-3}$ and a thickness in the range of from 10 to 100 nanometers. A third region 703 corresponds to the p-SiGe base layer 607 having an impurity concentration in the range of from $1\times10^{18}$ to $5\times10^{19}$ cm$^{-3}$ and a thickness in the range of from 10 to 100 nanometers in which Ge is included in the range of from 5 to 20%. A fourth region 704 corresponds to the collector layer 603 and the buried layer 602 in which the collector layer 603 has an impurity concentration in the range of from $1\times10^{16}$ to $5\times10^{17}$ cm$^{-3}$ and the buried layer 602 has a high impurity concentration in the range of from $1\times10^{19}$ to $1\times10^{21}$ cm$^{-3}$ for reduction of the collector resistance.

The above described conventional bipolar transistor has serious problems as follows. Process for forming the BiCMOS semiconductor device involving the bipolar transistor includes a heat treatment that may cause a thermal diffusion of p-type impurity boron involved in the p-SiGe base layer 607 into the n-type collector layer 603 thereby a boundary between the base region and the collector region moves toward the collector region as represented broken line 705 in FIG. 2. The diffusion of the p-type impurity boron from the base region into the collector region results in a shift of the boundary between the base and collector regions toward the collector region, while a boundary between the SiGe layer and the Si layer or the hetero-junction still remain. The discrepancy of the boundary between the base-collector regions from the SiGe/Si hetero-junction creates a parasite-potential barrier 709 in the base region but at an adjacent portion to the collector region as illustrated in FIG. 3. As described above, the boron doped p-SiGe base layer 607 is grown by molecular beam epitaxey where the p-SiGe base layer 607 remains within a region 706. However, the deposited p-SiGe base layer 607 is then subjected to an influence due to a heat treatment carried out after the deposition of the base layer 607. The p-type impurity boron in the base layer 607 shows a thermal diffusion toward the collector region to move in a Si diffusion region 707 thereby the base region 706 also expands to the diffusion region 707. Then, a region 708 represents a base layer 607 comprising the p-SiGe region 706 and the p-Si region 707 after the thermal diffusion of the boron occurs. As well known, silicon germanium has a narrower band gap than a band gap of silicon. Then, the resultant base region 607 comprises the p-SiGe region 706 and the p-Si region 707 in which the p-SiGe region 706 has a narrower band gap than a band gap of the p-Si region 707. In the base region 708, the wider band gap of the p-Si region 707 constitutes the parasitic potential barrier 709 in the p-Si region 707. A relationship between a height of the parasitic potential barrier 709 and a degree of the boron diffusion is disclosed by Prinz et al. in 1989, IEDM Technical Digest, pp. 639–641. The parasitic potential barrier 709 prevents electrons in the SiGe region 706 from being injected into the collector region thereby resulting in a reduction of the number of electrons able to reach to the collector region. Namely, collector current is reduced.

The parasitic potential barrier also provides a drop of a cutoff frequency $f_T$ thereby resulting in a deterioration of a high sped performance of the hetero-junction bipolar transistor. The drop of the cutoff frequency is as large a collector current density is high. A relationship of the cutoff frequency versus the collector current is illustrated in FIG. 4 for the hetero-junction bipolar transistor 710 having the parasitic potential barrier 709 as described above and a homo-junction bipolar transistor 711. From FIG. 4, it could be understood that in a high cutoff frequency region region the homo-junction bipolar transistor 711 has a higher cutoff frequency than a cutoff frequency of the hetero junction bipolar transistor 710, while in a low cutoff frequency region the homo-junction bipolar transistor 711 has a lower cutoff frequency than a cutoff frequency of the hetero-junction bipolar transistor 710.

The parasitic potential barrier also provides a delay in base traveling time of electrons. FIG. 5 illustrates a ratio of the base traveling time of boron-diffused base region to the diffusion-free base region versus a depth of the boron diffusion toward the collector region. From FIG. 5, it is understood that a boron diffusion at a depth of 10 nanometers or more results in increase of the base traveling time. Particularly, a boron diffusion at a large depth more than 20 nanometers results in a considerable increase of the base traveling time. The increase of the base traveling time provides a drop of the cutoff frequency of the bipolar transistor. The drop of the cutoff frequency leads to a poor high frequency performance of the bipolar transistor. Accordingly, the boron diffusion from the base region toward to collector region provides a poor high frequency performance to the bipolar transistor.

In the BiCMOS semiconductor device, the bipolar transistor is operated in a high collector current region for high speed charge and discharge operation of an output load capacitance. As described above, the hetero-junction bipolar transistor 710 has the low cutoff frequency in the high collector current region rather than the homo-junction bipolar transistor. In summary, using the bipolar transistor having the parasitic potential barrier results in inferior performance of the BiCMOS semiconductor device. The hetero-junction bipolar transistor with the parasitic potential barrier used in the BiCMOS semiconductor device and being operated in the high collector current region has an inferior driving ability to drive the load capacitance a compared to the homo-junction bipolar transistor.

To settle the above problem with the inferiority of the load capacitance driving ability due to the parasitic potential barrier, it was proposed to enlarge an emitter size because the enlargement of the emitter size results in raising the cutoff frequency $f_T$. Nevertheless, to secure the necessary high cutoff frequency, the hetero-junction bipolar transistor requires a larger emitter size than an emitter size of the homo-junction bipolar transistor by two to four times. Such a large emitter size for the hetero-junction bipolar transistor makes it difficult to obtain the necessary high density integration of the BiCMOS semiconductor device. Such inferior device performance of the hetero-junction bipolar transistor is due to the necessity for operation in the high collector current region for driving the load capacitance.

On the other hand, when the hetero-junction bipolar transistor is used in an emitter coupled logic circuit, the bipolar transistor is operated in a relatively low collector current region. In each a case, the hetero-junction bipolar transistor with the parasitic potential barrier is relatively free from the problem with the drop of the cutoff frequency and the inferiority in the device performance.

In any event, the conventional hetero-junction bipolar transistor used in the BiCMOS semiconductor device has been engaged with the above serious problems because, in the prior art, it is difficult to use a low temperature and short time heat treatment that suppresses the boron diffusion toward the collector region.

SUMMARY OF THE INVENTION

Accordingly, it is a primary object of the present invention to provide a novel BiCMOS semiconductor device free from any problem as described above.

It is another object of the present invention to provide a novel BiCMOS semiconductor device having an improved bipolar transistor showing a high frequency and high speed performance.

It is still another object of the present invention to provide a novel BiCMOS semiconductor device having an improved bipolar transistor having a high cutoff frequency in a wide range in collector current.

It is yet another object of the present invention to provide a novel BiCMOS semiconductor device having an improved bipolar transistor having a small size being suitable for a high density integration of the BiCMOS semiconductor device.

The above and other objects, features and advantages of the present invention will be apparent from the following descriptions.

The invention provides a novel semiconductor device including at least a pair of a hetero-junction bipolar transistor and a homo-junction bipolar transistor in which in a relatively low collector current region, only the hetero-junction bipolar transistor is operated, while in a relatively high collector current region, only the homo-junction bipolar transistor is operated so that in overall collector current region one showing a higher cutoff frequency is selected for high frequency and high speed operation from the group consisting of the homo-junction and hetero-junction bipolar transistors. It is permitted that at least any one of the homo-junction and hetero-junction bipolar transistors has a selective epitaxial base layer.

BRIEF DESCRIPTION OF THE DRAWINGS

Preferred embodiments of the present invention will hereinafter be described in detail with reference to the accompanying drawings.

FIG. 2 is a diagram illustrative of an impurity concentration profile in a direction at a depth for the conventional hetero-junction bipolar transistor of FIG. 1.

FIGS. 3(A–C) is a diagram illustrative of an energy band gap profile of the conventional hetero-junction bipolar transistor of FIG. 1.

FIGS. 7A to 7F are fragmentary cross sectional elevation views illustrative of sequential steps involved in processes for fabrication of a novel BiCMOS semiconductor device of FIG. 6.

FIG. 10 is a circuit diagram of emitter coupled logic circuit according to the present invention.

FIG. 11 is a circuit diagram of BiCMOS circuit according to the present invention.

PREFERRED EMBODIMENTS OF THE INVENTION

Figure 1:
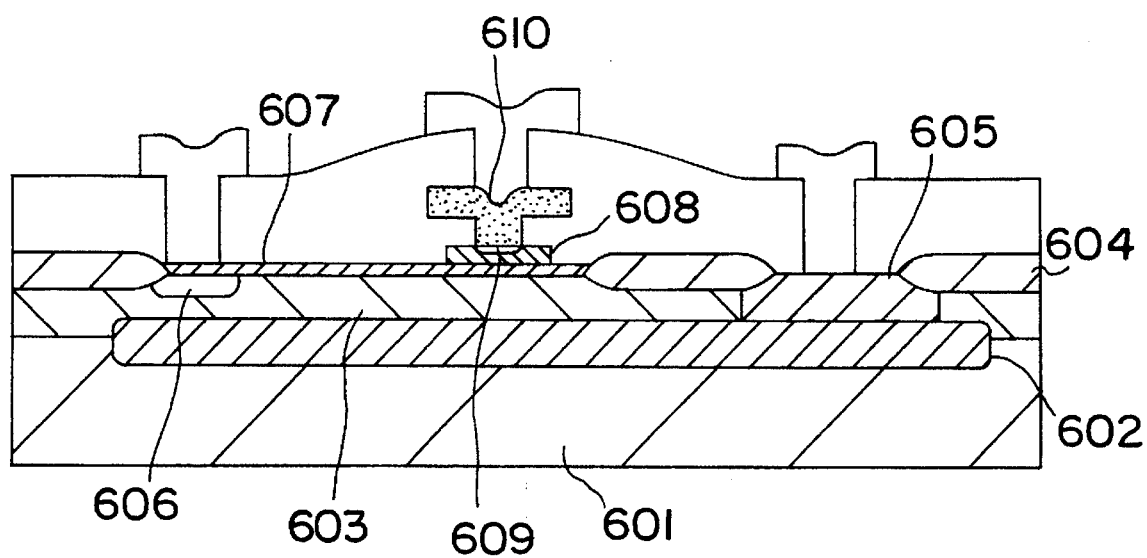
FIG. 1 is a fragmentary cross sectional elevation view illustrative of the conventional hetero-junction bipolar transistor.
Figure 4:
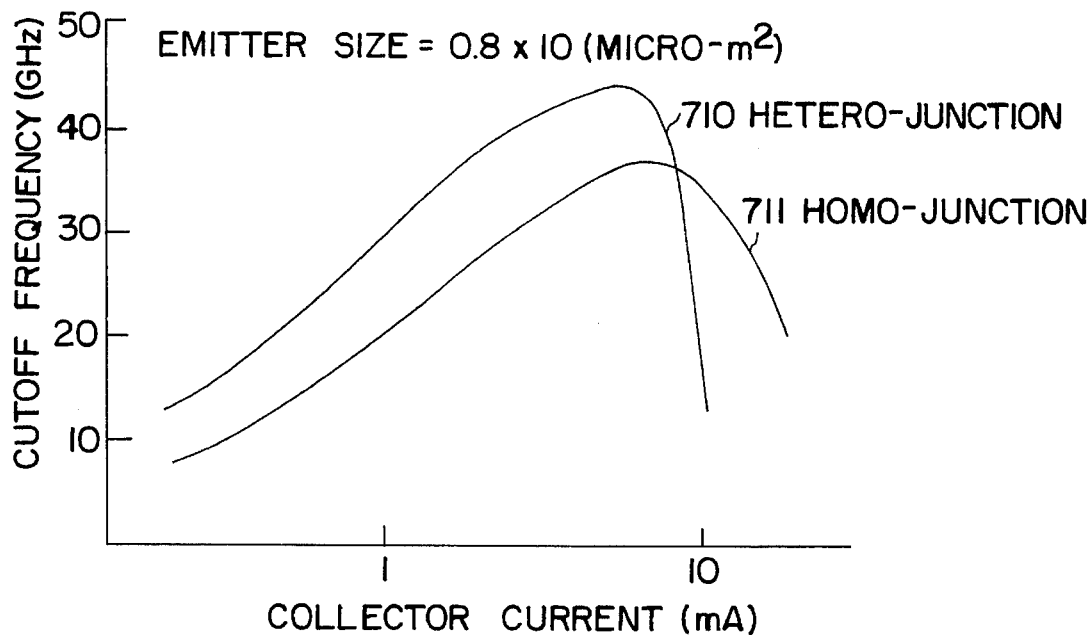
FIG. 4 is a diagram illustrative of cutoff frequencies of hetero-junction and homo-junction bipolar transistors versus a collector current.
Figure 5:
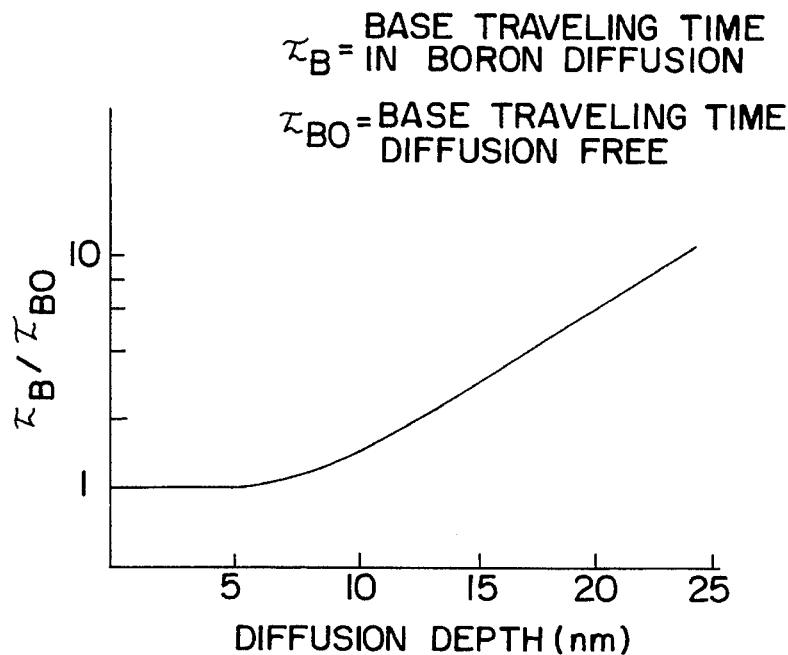
FIG. 5 is a diagram illustrative of a ratio of base traveling time of boron diffused base layer to diffused-free base layer versus a depth of boron diffusion toward a collector region in the hetero-junction bipolar transistor.
Figure 6:
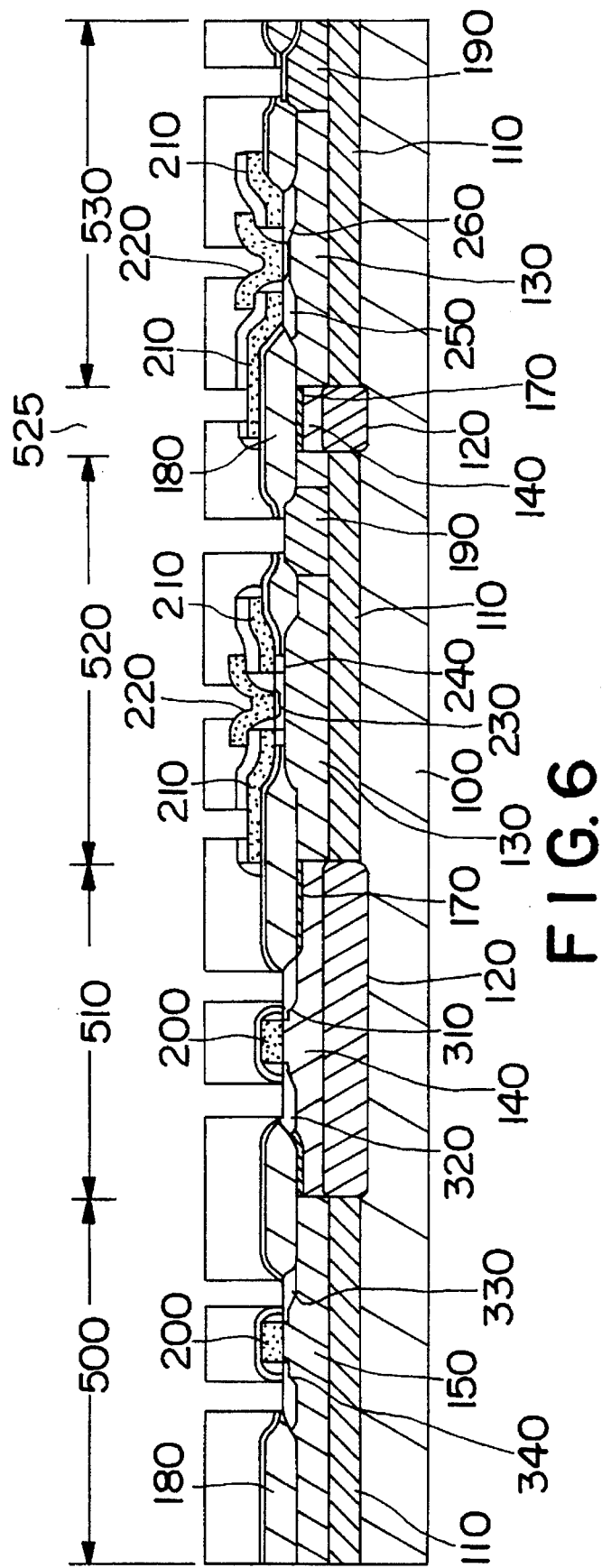
FIG. 6 is a fragmentary cross sectional elevation view illustrative of a novel BiCMOS semiconductor device including a pair of homo-junction and hetero-junction bipolar transistors in a first embodiment according to the present invention.

The present invention provides a Bi-CMOS semiconductor device as illustrated in FIG. 6 comprising a semiconductor substrate 100, at least a pair of complementary p-channel and n-channel MOS transitor regions 500 and 510 and at least a pair of hetero-junction and homo-junction bipolar transistor regions 520 and 530. The hetero-junction bipolar transistor 520 has a SiGe epitaxial base layer 230, while the homo-junction bipolar transistor transistor 530 has a silicon intrinsic base layer 260. The hetero-junction bipolar transistor is operated in a low collector current region less than a critical collector current value at which the hetero-junction bipolar transistor has the maximum value of the cutoff frequency, while the homo-junction bipolar transistor is operated in a high collector current region more than a critical collector current value at which the homo-junction bipolar transistor has the maximum value of the cutoff frequency. The hetero-junction bipolar transistor may be used for the emitter coupled logic circuit (ECL circuit) or NTL circuit. The homo-junction bipolar transistor is suitable for driving a load capacitance connected to an output terminal of the BiCMOS circuit.

From the above descriptions, it could be understood that when the BiCMOS circuit is provided at an adjacent portion to the emitter coupled logic circuit as illustrated in FIGS. 10 and 11, the hetero-junction bipolar transistor is used for driving the load capacitance connective to the BiCMOS circuit and the homo-junction bipolar transistor is used for the emitter coupled logic circuit.

In the p-channel MOS transistor 500, an n-type buried layer 110 is formed on the semiconductor substrate 100. An n-type well region 150 is formed on the n-type buried layer 110. A pair of p-type lightly doped source and drain regions 330 and 340 is formed in an upper portion of the n-type well region 150. A p-channel region is defined between the source and drain regions 330 and 340. A gate electrode 200 formed of a polysilicon film is formed over the p-channel region through a gate oxide film.

The n-channel MOS transistor 510 is isolated from the p-channel MOS transistor 500 by a combination of a field oxide film 180 and a channel stopper 170 formed under the field oxide film 180. In the n-channel MOS transistor 510, a p-type buried layer 120 is formed on the semiconductor substrate 100. A p-type well region 140 is formed on the p-type buried layer 120. A pair of n-type lightly doped source and drain regions 310 and 320 is formed in an upper portion of the p-type well region 140. An n-channel region is defined between the source and drain regions 310 and 320. A gate electrode 200 of a polysilicon film is formed over the n-channel region through a gate oxide film.

The hetero-junction bipolar transistor 520 is isolated from the n-channel MOS transistor 510 by the field oxide film 180. In the hetero-junction bipolar transistor 520, an n-type buried layer 110 is formed on the semiconductor substrate 100. An n-type epitaxial layer 130 serving as a collector region is formed on the n-type buried layer 110. An epitaxial SiGe base layer 230 is formed on the n-type epitaxial collector layer 130. An n-type emitter region is selectively formed in an upper portion of the SiGe epitaxial base layer 230. A graft base layer 240 is formed around the epitaxial SiGe base layer 230 so that the epitaxial SiGe base layer is electrically connected through the graft base layer 240 to a base plug electrode 210 of a polysilicon film. The emitter region is also connected with an emitter plug electrode 220 of a polysilicon film. The collector n-epitaxial layer 130 is connected with a collector plug diffusion region 190.

The homo-junction bipolar transistor 530 is isolated from the hetero-junction bipolar transistor 520 by the field oxide film 180, the channel stopper 170, a p-type well region 140 and a p-type buried layer 120. In the homo-junction bipolar transistor 530, the n-type buried layer 110 is formed on the semiconductor substrate 100. The n-type epitaxial layer 130 serving as a collector region is formed on the n-type buried layer 110. A Si intrinsic base layer 260 is formed on the n-type epitaxial collector layer 130. An n-type emitter region is selectively formed in an upper portion of the Si intrinsic base layer 260. A graft base layer 250 is formed around the Si intrinsic base layer 260 so that the Si intrinsic base layer 260 is electrically connected through the graft base layer 250 to the base plug electrode 210. The emitter region is also connected with the emitter plug electrode 220 of a polysilicon film. The collector n-epitaxial layer 130 is connected with the collector plug diffusion region 190.

The description will subsequently focus, by referring to FIGS. 7A to 7F, on processes for fabricating the BiCMOS semiconductor device including the complementary MOS transistor regions 500 and 510 and a pair of the hetero-junction and homo-junction bipolar transistor regions 520 and 530 in the first embodiment according to the present invention.

An ion-implantation of Sb is carried out at a dose in the range of from $1\times10^{15}$ to $1\times10^{16}$ atom/cm$^2$ to introduce Sb impurity into the semiconductor substrate 100 but only in the p-channel MOS transistor region 500, the hetero-junction and homo-junction bipolar transistor regions 520 and 530. Subsequently, a selective ion-implantation of boron is carried out at a dose in the range of from $1\times10^{13}$ to $1\times10^{14}$ atom/cm$^2$ to introduce boron impurity into the semiconductor substrate 100 but only in the n-channel MOS transistor region 510 and in the isolation region 525. A heat treatment is carried out to cause diffusions of Sb and boron into the semiconductor substrate to form the n-type and p-type buried regions 110 and 120. The n-type epitaxial layer 130 having a thickness in the range of from 1.0 to 1.5 micrometers is grown on the n-type buried layer 110 on the buried layer in the entire region. A selective ion-implantation of phosphorus into the n type epitaxial layer 130 but only in the p-channel MOS transistor region 500 is carried out at a dose in the range of from $1\times10^{12}$ to $1\times10^{13}$ atom/cm$^2$ and an acceleration energy in the range of from 100 to 150 KeV to from the n-type well region 150. A selective ion-implantation of boron into the n-type epitaxial layer 130 but only in the n-channel MOS transistor region 510 and in the isolation region 525 is carried out at a dose in the range of from $1\times10^{12}$ to $1\times10^{13}$ atom/cm$^2$ and an acceleration energy in the range of from 100 to 150 KeV to from the p-type well region 140. A heat treatment is carried out at a temperature of 1000° C. in a nitrogen atmosphere for 100 minutes to cause a thermal diffusion of the implanted phosphorus atoms to form the n-type and p-type well regions 150 and 140.

A grown surface of the device is subjected to a thermal oxidation to form a silicon oxide film having a thickness in the range of from 20 to 40 micrometers. A silicon nitride film having a resistivity to the oxidation is selectively formed in the p-type and n-type MOS transistor regions 500 and 510 and in the hetero-junction and homo-junction bipolar transistor regions 520 and 530. A selective ion-implantation of boron but only in a passive region in the n-channel MOS transistor region 510 and in the isolation region 525 is carried out at a dose in the range of from $1\times10^{12}$ to $1\times10^{13}$ atom/cm$^2$ and an acceleration energy in the range of from 40 to 50 KeV to form the channel stopper 170. The growth surface of the device is subjected to a selective thermal oxidation using the silicon nitride film as a mask to form the field oxide film 180. The thermal oxidation may be carried out by use of a hot steam at a temperature of 1000° C. so that the field oxide film 180 may have a thickness in the range of from 400 to 500 nanometers. Thereafter, the silicon nitride film is removed. A selective ion-implantation of phosphorus but only in a predetermined part in the hetero-junction and homo-junction bipolar transistor regions 520 and 530 is carried out at a dose in the range of from $1\times10^{15}$ to $1\times10^{16}$ atom/cm$^2$ and an acceleration energy in the range of from 70 to 80 KeV to from the collector plug region 190. A heat treatment is carried out at a temperature in the range of from 950° to 1000° C. for 30 minutes to make the collector plug region 190 contact with the n-type buried layer 110, to thereby grow a device as illustrated in FIG. 7A.

An ion-implantation of boron or phosphorus into the n-type well region in the p-channel MOS transistor region 500 and in the p-type well region 140 in the n-channel MOS transistor region 510 is carried out to control threshold voltages of the p-channel and n-channel MOS transistors. The silicon oxide film 16 formed by the thermal oxidation is selectively removed in the n-type and p-type well regions 150 and 140 so as to have surfaces of the n-type and p-type well regions 150 and 140 exposed. The exposed surfaces of the n-type and p-type well regions 150 and 140 are subjected to a hot stream at a temperature in the range of from 800° to 900° C. to cause a silicon oxidation thereby a gate oxide film 195 having a thickness in the range of from 10 to 20 nanometers is formed. A polysilicon film 200 having a thickness in the range of from 200 to 400 nanometers is deposited on an entire surface of the device or on the field oxide film 180 and the gate oxide film 195 by use of a chemical vapor deposition method. An ion-implantation of phosphorus into the polysilicon film 200 is carried out to introduce phosphorus atoms into the polysilicon film 200 thereby resulting in a reduction of a resistance of the polysilicon film 200. As required, it is available to form a siliside (WSi$_2$) layer of a high melting point metal to obtain a polyside structure. The polysilicon film 200 is then patterned by use of an anisotropic etching such as reactive ion etching using a photoresist mask to form the gate electrode 200. A selective ion-implantation of phosphorus but only in a predetermined part in the n-channel MOS transistor region 510 is carried out by a self-alignment technique using the gate electrode 200 and the filed oxide film 180 as masks at a dose in the range of from $1\times10^{13}$ to $1\times10^{14}$ atoms/cm$^2$ and an acceleration energy in the range of from 50 to 70 KeV to from the lightly doped source and drain regions. A selective ion-implantation of boron but only in a predetermined part in the p-channel MOS transistor region 500 is carried out by a self-alignment technique using the gate electrode 200 and the filed oxide film 180 as masks at a dose in the range of from $1\times10^{13}$ to $1\times10^{14}$ atoms/cm$^2$ and an acceleration energy in the range of from 30 to 50 KeV to form the lightly doped source and drain regions. A silicon oxide film having a thickness in the range of from 200 to 300 nanometers is formed on an entire surface of the device by use of a chemical vapor deposition method. The deposited silicon oxide film is subjected to an anisotropic etching such as the reactive ion etching to leave the silicon oxide film but only opposite sides of the gate electrode to form side wall spacers 315 at the opposite sides of the gate electrode 200. A selective ion-implantation of arsenic but only in a predetermined part in the n-channel MOS transistor region 510 is carried out by a self-alignment technique using the gate electrode 200 with the wide walls and the field oxide film 180 as masks at a dose in the range of from $1\times10^{15}$ to $1\times10^{16}$ atoms/cm$^2$ and an acceleration energy in the range of from 70 to 80 KeV to form the source and drain regions 310 and 320. A selective ion-implantation of fluoroborate but only in a predetermined part in the p-channel MOS transistor region 500 is carried out by a self-alignment technique using the gate electrode 200 with the wide walls and the field oxide film 180 as masks at a dose in the range of from $1\times10^{15}$ to $1\times10^{16}$ atoms/cm$^2$ and an acceleration energy in the range of from 70 to 80 KeV to form the source and drain regions 330 and 340. A silicon oxide film 350 having a thickness in the range of from 50 to 100 nanometers is deposited on an entire surface of the device by use of a chemical vapor deposition thereby a device was fabricated as illustrated in FIG. 7B.

Figure 7C:
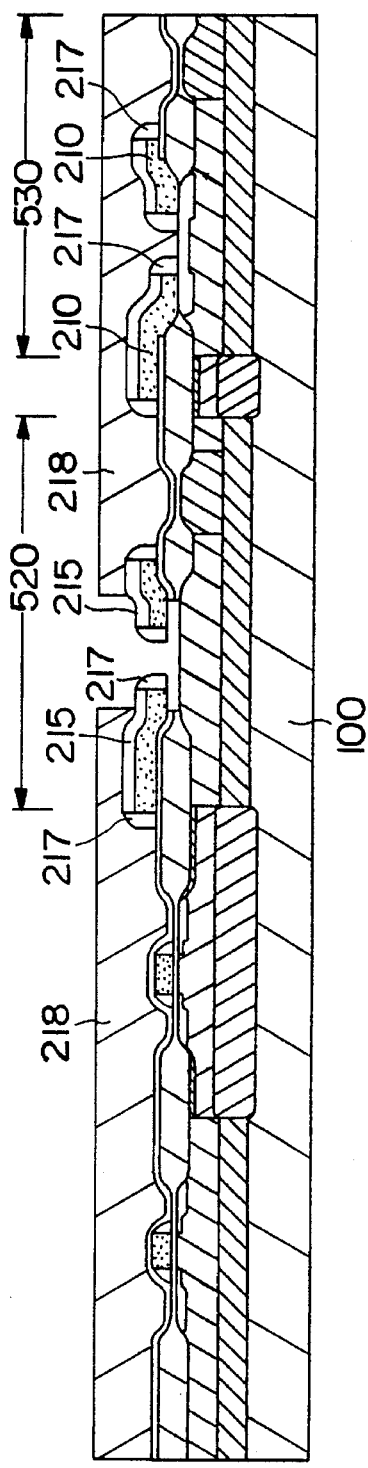

The silicon oxide film 350 is selectively removed to have a surface of the n-type epitaxial layer 130 exposed in the homo-junction bipolar transistor region 530. A polysilicon film 210 having a thickness in the range of from 200 to 400 nanometers is deposited on an entire surface of the device by use of a chemical vapor deposition. A selective ion-implantation of boron into the polysilicon film 210 is carried out at a dose in the range of from $1\times10^{15}$ to $1\times10^{16}$ atoms/cm$^2$ and an acceleration energy in the range of from 30 to 40 KeV. A silicon nitride film 215 having a thickness in the range of from 200 to 300 nanometers is deposited on an entire surface of the polysilicon film 210 by use of a chemical vapor deposition method. The silicon nitride film 215 and the polysilicon film 210 are sequentially subjected to a selective anisotropic etching for subsequent formations of base plug polysilicon films of the bipolar transistors and formations of openings in the emitter regions thereby the n-type epitaxial layer 130 is partially exposed through the openings in the emitter regions. The exposed surface of the n-type epitaxial layer 130 in the emitter regions of the bipolar transistor regions 520 and 530 is subjected to a heat treatment at a temperature in the range of from 800° to 900° C. as a dry oxidation method to form a silicon oxide film 216 having a thickness in the range of from 10 to 50 nanometers. Concurrently, side faces of the polysilicon film are formed with a silicon oxide film. A heat treatment is carried out at a temperature in the range of from 800° to 900° C. in a nitrogen atmosphere for 10 to 30 minutes to cause a thermal diffusion of boron in the polysilicon film 210 toward n-type epitaxial layer 130 but only in the homo junction bipolar transistor region 530 to form the graft base regions 250. The n-type epitaxial layer 130 in the hetero-junction bipolar transistor region 520 is still covered with the silicon oxide film 350. This prevents a diffusion of the boron in the polysilicon film 210 into the n-type epitaxial layer 130 in the hetero-junction bipolar transistor region 520. An ion-implantation of boron into the n-type epitaxial layer 130 through the opening in the emitter region in the homo-junction bipolar transistor region 530 is carried out by use of the self-alignment technique at a dose in the range of from $1\times10^{13}$ to $1\times10^{14}$ atoms/cm$^2$ and an acceleration energy in the range of from 10 to 30 KeV to form the intrinsic base region 260 thereby a device is fabricated as illustrated in FIG. 7C.

Figure 7D:
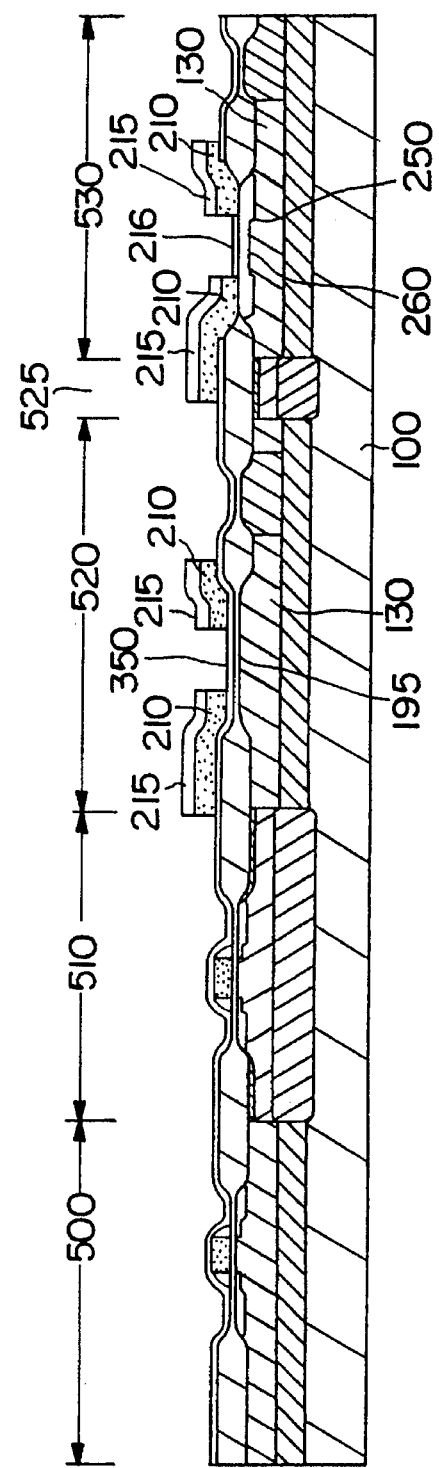
Figure 7E:
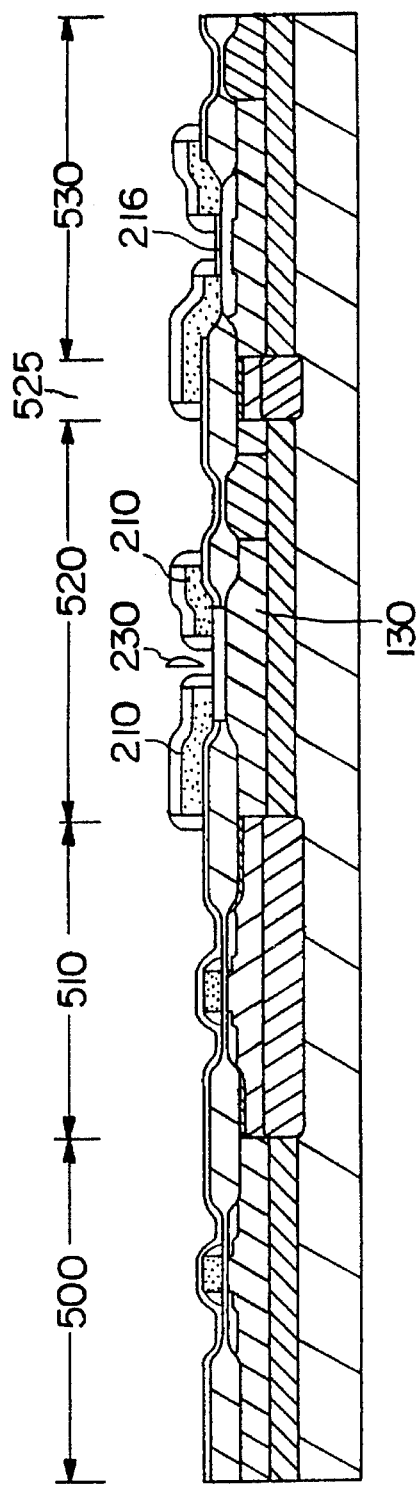

A silicon nitride film having a thickness in the range of from 100 to 300 nanometers is deposited on an entire surface of the device. The deposited silicon nitride film is selectively removed by an anisotropic etching to leave the silicon nitride film but only at opposite sides of each of the remaining polysilicon film 210 to form side wall spacers 217 at opposite sides of each of the polysilicon film 210. The silicon oxide films 350 and 195 underlying the polysilicon film in the hetero-junction bipolar transistor region 520 is selectively removed by use of a photoresist 218 as a mask in which an etchant may be a liquid containing fluorine and ammonium fluoride. The exposed silicon nitride film 215 and the exposed silicon nitride side wall spacers 217 remain without removal by the etchant thereby a device is fabricated as illustrated in FIG. 7D. The SiGe epitaxial base layer 230 is selectively and epitaxially grown on an exposed surface of the n-type epitaxial layer 130 wherein the SiGe epitaxial base layer 230 has a thickness in the range of from 30 to 100 nanometers and a Ge content in the range of from 5 to 20%. The growth may be carried out under the conditions of a temperature of 650° C. and flow rates of $Si_2H_6$ and $GeH_4$ are 1 SCCM and 1 SCCM respectively. As described above, an entire surface of the device except for the exposed n-type epitaxial layer 130 in the hetero-junction bipolar transistor region 520 has been covered by either the silicon oxide film and the silicon nitride film. Then, the SiGe epitaxial layer may epitaxially and selectively be grown but only on the epitaxial layer 130 and never grown on the silicon oxide film and the silicon nitride film. The SiGe epitaxial base layer 230 extends under the polysilicon layer 210 and the side wall spacers 217 thereby a device is fabricated as illustrated in FIG. 7E.

Figure 7F:
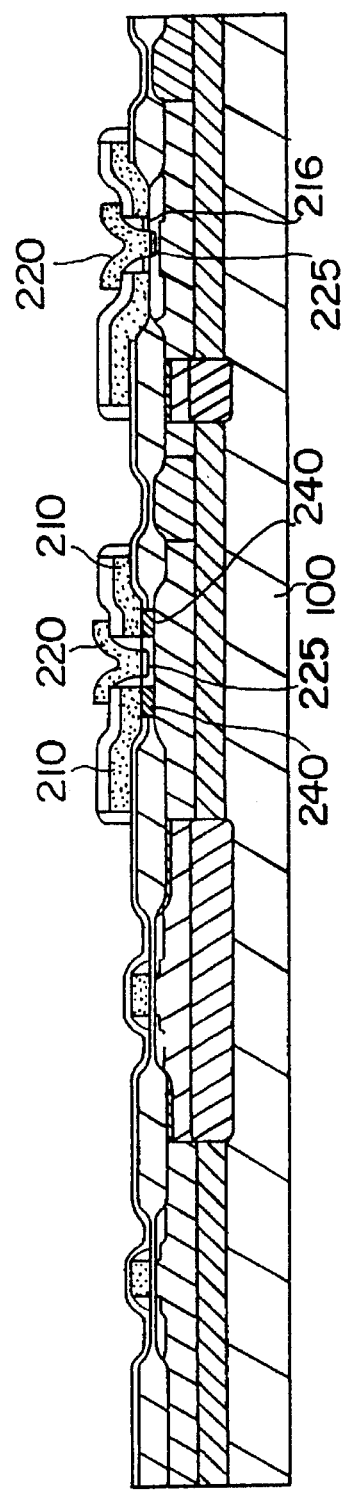

The silicon oxide film 216 in the emitter region in the homo-junction bipolar transistor region is selectively removed. A polysilicon film 220 having a thickness in the range of from 200 to 300 nanometers on an entire surface of the device by use of a chemical vapor deposition method. An ion-implantation of arsenic into the deposited polysilicon film 220 is carried out at a dose in the range of from $5 \times 10^{15}$ to $1 \times 10^{16}$ (atoms/cm$^2$) and an acceleration energy of 70 KeV. The polysilicon film implanted with the impurity is then selectively removed by use of an anisotropic etching to leave the polysilicon film but only in the emitter regions both in the hetero-junction bipolar transistor region 520 and in the homo-junction bipolar transistor region 530 to form the emitter plug electrodes. A high temperature and short duration annealing is carried out at a temperature in the range of from 1000° to 1100° C. for 10 to 30 seconds to cause a thermal diffusion of the arsenic into the SiGe epitaxial base region 230 in the hetero-junction bipolar transistor region 520 and into the intrinsic base layer 260 in the homo-junction bipolar transistor region 530. The above thermal diffusion results in that the arsenic atoms in the emitter plug polysilicon film 220 move into the base regions 230 and 216 and then reach at a depth in the range of from 0.05 to 0.1 micrometers thereby the emitter regions 225 are formed in an upper region of each of the base regions 230 and 260 in the hetero-junction and homo-junction bipolar transistors. Concurrently, the above annealing process may also cause a further diffusion of the boron atoms from the polysilicon film 210 into the SiGe epitaxial base region 230 in the hetero-junction bipolar transistor region 520 and into the intrinsic base layer 260 in the homo-junction bipolar transistor region 530 thereby the graft base regions 240 and 250 in the hetero-junction and homo-junction bipolar transistor regions 520 and 530 so that a device was fabricated as illustrated in FIG. 7F.

An inter-layer insulator made of silicon oxide is deposited on an entire surface of the device by use of a chemical vapor deposition method wherein the inter-layer insulator has a thickness in the range of from 300 to 500 nanometers. The inter-layer insulator is selectively removed by etching to form contact holes for the bipolar transistors and the MOS transistors thereby the device as illustrated in FIG. 6 is fabricated. Thereafter, metal electrodes and wiring layers are formed as required to complete the fabrication processes of the BiCMOS semiconductor device of the first embodiment according to the present invention.

Figure 8:
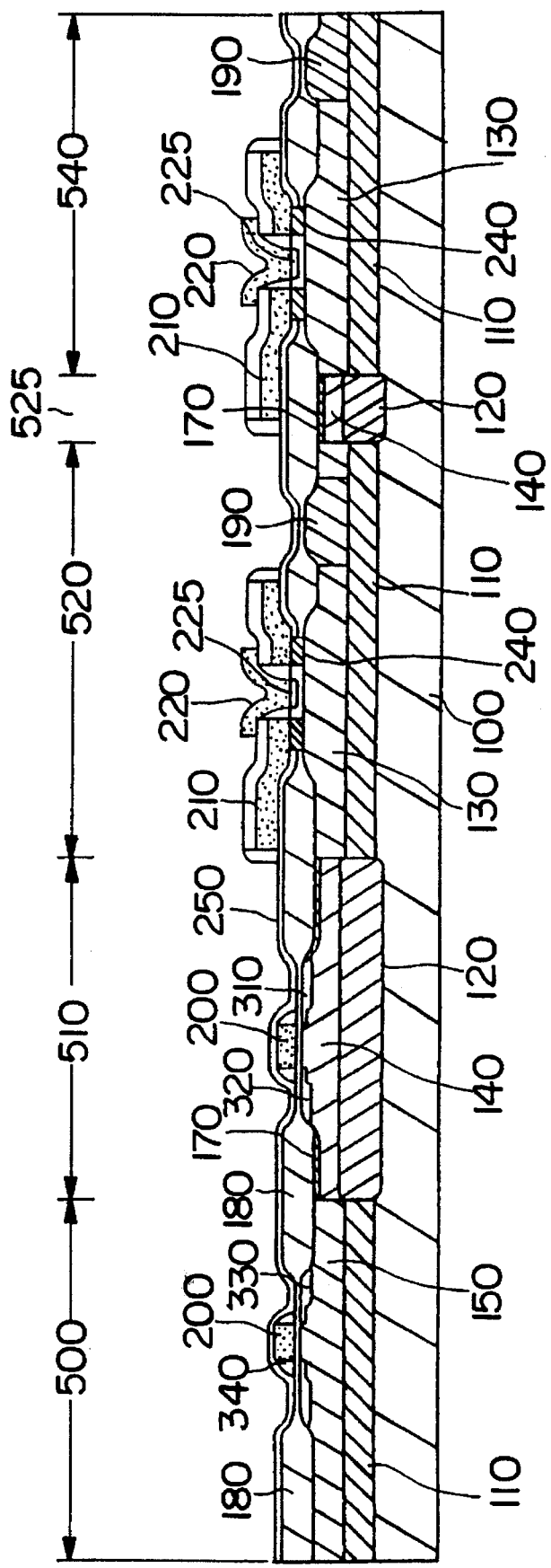
FIG. 8 is a fragmentary cross sectional elevation view illustrative of a novel BiCMOS semiconductor device including a pair of homo junction and hetero-function bipolar transistors in a second embodiment according to the present invention.

The present invention provides another Bi-CMOS semiconductor device of a second embodiment as illustrated in FIG. 8. This Bi-CMOS semiconductor device has a structural difference from that of the first embodiment in the base layer of the homo-junction bipolar transistor. Namely, the Bi-CMOS semiconductor devices of the first and second embodiments have the same structure except for the base layer in the homo-junction bipolar transistor. In the second embodiment, the base layer of the homo-junction bipolar transistor comprises an epitaxial silicon layer so as to permit a very thin base layer to be formed for obtaining a small base width. The small base width may permit an improvement in a high cutoff frequency of the homo-junction bipolar transistor.

This Bi-CMOS semiconductor device comprises a semiconductor substrate 100, at least a pair of complementary p-channel and n-channel MOS transistor regions 500 and 510 and at least a pair of hetero-junction and homo-junction bipolar transistor regions 520 and 540. The hetero-junction bipolar transistor 520 has a SiGe epitaxial base layer 230, while the homo-junction bipolar transistor transistor 540 has a silicon epitaxial base layer 261. The hetero-junction bipolar transistor is operated in a low collector current region less than a critical collector current value at which the hetero-junction bipolar transistor has the maximum value of the cutoff frequency, while the homo-junction bipolar transistor is operated in a high collector current region more than a critical collector current value at which the homo-junction bipolar transistor has the maximum value of the cutoff frequency. The hetero-junction bipolar transistor may be used for the emitter coupled logic circuit (ECL circuit) or NTL circuit. The homo-junction bipolar transistor is suitable for driving a load capacitance connected to an output terminal of the BiCMOS circuit.

From the above descriptions, it could be understood that when the BiCMOS circuit is provided at an adjacent portion to the emitter coupled logic circuit as illustrated in FIGS. 10 and 11, the hetero-junction bipolar transistor is used for driving the load capacitance connective to the BiCMOS circuit and the homo-junction bipolar transistor is used for the emitter coupled logic circuit.

In the p-channel MOS transistor 500, an n-type buried layer 110 is formed on the semiconductor substrate 100. An n-type well region 150 is formed on the n-type buried layer 110. A pair of p-type lightly doped source and drain regions 330 and 340 is formed in an upper portion of the n-type well region 150. A p-channel region is defined between the source and drain regions 330 and 340. A gate electrode 200 formed of a polysilicon film is formed over the p-channel region through a gate oxide film.

The n-channel MOS transistor 510 is isolated from the p-channel MOS transistor 500 by a combination of a field oxide film 180 and a channel slopper 170 formed under the field oxide film 180. In the n-channel MOS transistor 510, a p-type buried layer 120 is formed on the semiconductor substrate 100. A p-type well region 140 is formed on the p-type buried layer 120. A pair of n-type lightly doped source and drain regions 310 and 320 is formed in an upper portion of the p-type well region 140. An n-channel region is defined between the source and drain regions 310 and 320. A gate electrode 200 of a polysilicon film is formed over the n-channel region through a gate oxide film.

The hetero-junction bipolar transistor 520 is isolated from the n-channel MOS transistor 510 by the field oxide film 180. In the hetero-junction bipolar transistor 520, an n-type buried layer 110 is formed on the semiconductor substrate 100. An n-type epitaxial layer 130 serving as a collector region is formed on the n-type buried layer 110. An epitaxial SiGe base layer 230 is formed on the n-type epitaxial collector layer 130. An n-type emitter region is selectively formed in an upper portion of the SiGe epitaxial base layer 230. A graft base layer 240 is formed around the epitaxial SiGe base layer 230 so that the epitaxial SiGe base layer is electrically connected through the graft base layer 240 to a base plug electrode 210 of a polysilicon film. The emitter region is also connected with an emitter plug electrode 220 of a polysilicon film. The collector n-epitaxial layer 130 is connected with a collector plug diffusion region 190.

The homo-junction bipolar transistor 540 is isolated from the hetero-junction bipolar transistor 520 by the field oxide film 180, the channel stopper 170, a p-type well region 140 and a p-type buried layer 120. In the homo-junction bipolar transistor 540, the n-type buried layer 110 is formed on the semiconductor substrate 100. The n-type epitaxial layer 130 serving as a collector region is formed on the n-type buried layer 110. An Si epitaxial base layer 261 is formed on the n-type epitaxial collector layer 130. An n-type emitter region is selectively formed in an upper portion of the Si epitaxial base layer 261. A graft base layer 240 is formed around the Si epitaxial base layer 261 so that the Si epitaxial base layer 261 is electrically connected through the graft base layer 240 to the base plug electrode 210. The emitter region is also connected with the emitter plug electrode 220 of a polysilicon film. The collector n-epitaxial layer 130 is connected with the collector plug diffusion region 190.

Figure 9A:
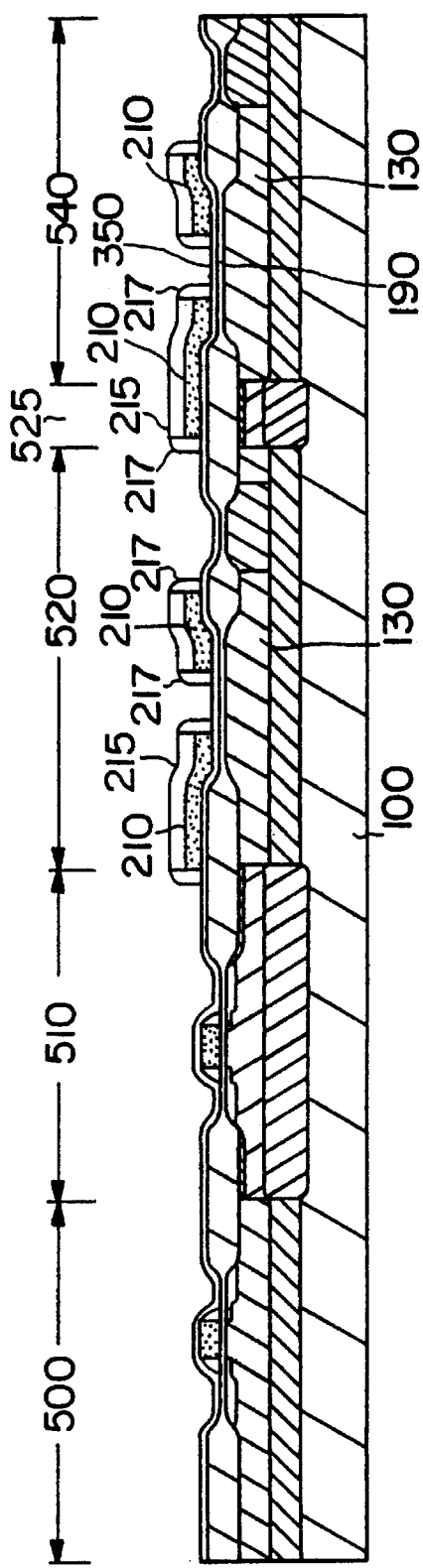
FIGS. 9A to 9C are fragmentary cross sectional elevation views illustrative of sequential steps involved in processes for fabrication of a novel BiCMOS semiconductor device of FIG. 8.
Figure 9B:
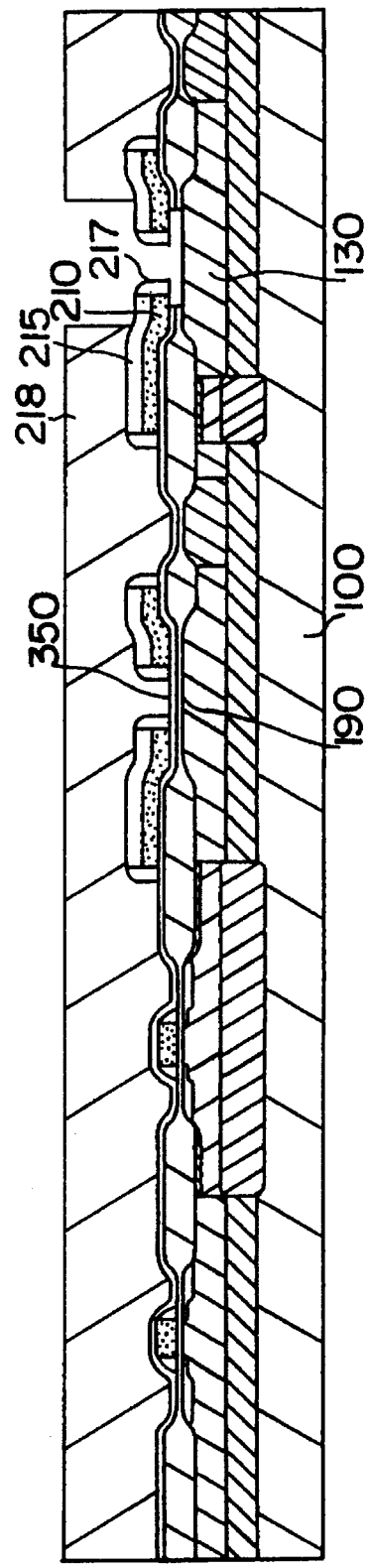
Figure 9C:
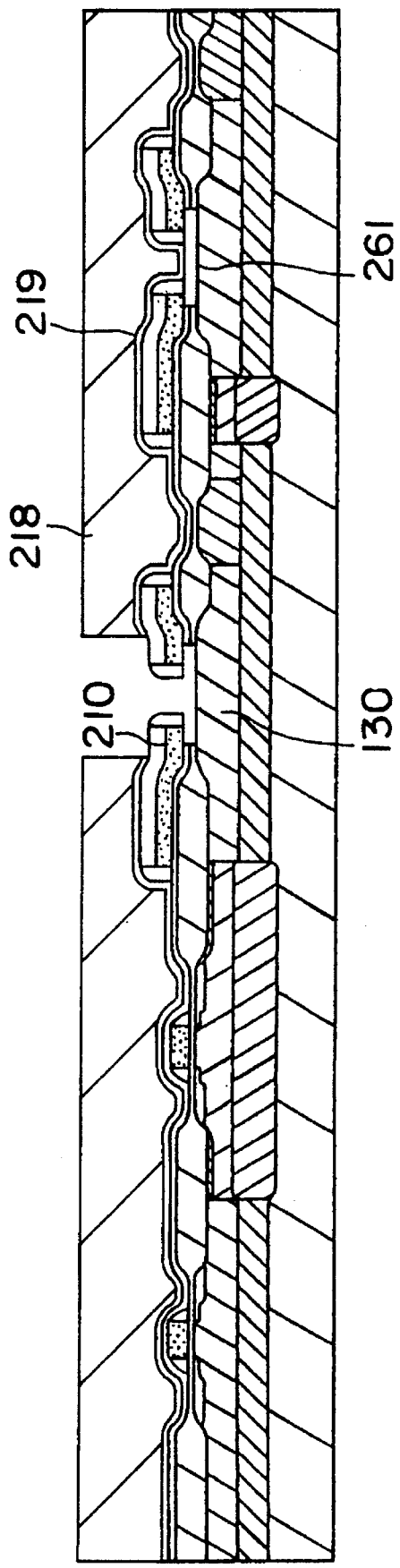

The description will subsequently focus, by referring to FIGS. 9A to 9C, on processes for fabricating the BiCMOS semiconductor device including the complementary MOS transistor regions 500 and 510 and a pair of the hetero-junction and homo-junction bipolar transistor regions 520 and 540 in the second embodiment according to the present invention.

An ion-implantation of Sb is carried out at a dose in the range of from $1\times10^{15}$ to $1\times10^{16}$ atoms/cm$^2$ to introduce Sb impurity into the semiconductor substrate 100 but only in the p-channel MOS transistor region 500, the hetero-junction and homo-junction bipolar transistor regions 520 and 540. Subsequently, a selective ion-implantation of boron is carried out at a dose in the range of from $1\times10^{13}$ to $1\times10^{14}$ atoms/cm$^2$ to introduce boron impurity into the semiconductor substrate 100 but only in the n-channel MOS transistor region 510 and in the isolation region 525. A heat treatment is carried out to cause diffusions of Sb and boron into the semiconductor substrate to form the n-type and p-type buried regions 110 and 120. The n-type epitaxial layer 130 having a thickness in the range of from 1.0 to 1.5 micrometers is grown on the n-type buried layer 110 on the buried layer in the entire region. A selective ion-implantation of phosphorus into the n-type epitaxial layer 130 but only in the p-channel MOS transistor region 500 is carried out at a dose in the range of from $1\times10^{12}$ to $1\times10^{13}$ atoms/cm$^2$ and an acceleration energy in the range of from 100 to 150 KeV to from the n-type well region 150. A selective ion-implantation of boron into the n-type epitaxial layer 130 but only in the n-channel MOS transistor region 510 and in the isolation region 525 is carried out at a dose in the range of from $1\times10^{12}$ to $1\times10^{13}$ atoms/cm$^2$ and an acceleration energy in the range of from 100 to 150 KeV to from the p-type well region 140. A heat treatment is carried out at a temperature of 1000° C. in a nitrogen atmosphere for 100 minutes to cause a thermal diffusion of the implanted phosphorus atoms to form the n-type and p-type well regions 150 and 140.

A grown surface of the device is subjected to a thermal oxidation to form a silicon oxide film having a thickness in the range of from 20 to 40 micrometers. A silicon nitride film having a resistivity to the oxidation is selectively formed in the p-type and n-type MOS transistor regions 500 and 510 and in the hetero-junction and homo-junction bipolar transistor regions 520 and 540. A selective ion-implantation of boron but only in a passive region in the n-channel MOS transistor region 510 and in the isolation region 525 is carried out at a dose in the range of from $1\times10^{12}$ to $1\times10^{13}$ atoms/cm$^2$ and an acceleration energy in the range of from 40 to 50 KeV to form the channel stopper 170. The growth surface of the device is subjected to a selective thermal oxidation using the silicon nitride film as a mask to form the field oxide film 180. The thermal oxidation may be carried out by use of a hot steam at a temperature of 1000° C. so that the field oxide film 180 may have a thickness in the range of from 400 to 500 nanometers. Thereafter, the silicon nitride film is removed. A selective ion-implantation of phosphorus but only in a predetermined part in the hetero-junction and homo-junction bipolar transistor regions 520 and 540 is carried out at a dose in the range of from $1\times10^{15}$ to $1\times10^{16}$ atoms/cm$^2$ and an acceleration energy in the range of from 70 to 80 KeV to from the collector plug region 190. A heat treatment is carried out at a temperature in the range of from 950° to 1000° C. for 30 minutes to make the collector plug region 190 contact with the n-type buried layer 110.

An ion-implantation of boron or phosphorus into the n-type well region in the p-channel MOS transistor region 500 and in the p-type well region 140 in the n-channel MOS transistor region 510 is carried out to control threshold voltages of the p-channel and n-channel MOS transistors. The silicon oxide film 16 formed by the thermal oxidation is selectively removed in the n-type and p-type well regions 150 and 140 so as to have surfaces of the n-type and p-type well regions 150 and 140 exposed. The exposed surfaces of the n-type and p-type well regions 150 and 140 are subjected to a hot stream at a temperature in the range of from 800° to 900° C. to cause a silicon oxidation thereby a gate oxide film 195 having a thickness in the range of from 10 to 20 nanometers is formed. A polysilicon film 200 having a thickness in the range of from 200 to 400 nanometers is deposited on an entire surface of the device or on the field oxide film 180 and the gate oxide film 195 by use of a chemical vapor deposition method. An ion-implantation of phosphorus into the polysilicon film 200 is carried out to introduce phosphorus atoms into the polysilicon film 200 thereby resulting in a reduction of a resistance of the polysilicon film 200. As required, it is available to form a siliside (WSi$_2$) layer of a high melting point metal to obtain a polyside structure. The polysilicon film 200 is then patterned by use of an anisotropic etching such as reactive ion etching using a photoresist mask to form the gate electrode 200. A selective ion-implantation of phosphorus but only in a predetermined part in the n-channel MOS transistor region 510 is carried out by a self-alignment technique using the gate electrode 200 and the filed oxide film 180 as masks at a dose in the range of from $1\times10^{13}$ to $1\times10^{14}$ atoms/cm$^2$ and an acceleration energy in the range of from 50 to 70 KeV to from the lightly doped source and drain regions. A selective ion-implantation of boron but only in a predetermined part in the p-channel MOS transistor region 500 is carried out by a self-alignment technique using the gate electrode 200 and the filed oxide film 180 as masks at a dose in the range of from $1\times10^{13}$ to $1\times10^{14}$ atoms/cm$^2$ and an acceleration energy in the range of from 30 to 50 KeV to form the lightly doped source and drain regions. A silicon oxide film having a thickness in the range of from 200 to 300 nanometers is formed on an entire surface of the device by use of a chemical vapor deposition method. The deposited silicon oxide film is subjected to an anisotropic etching such as the reactive ion etching to leave the silicon oxide film but only opposite sides of the gate electrode to form side wall spacers 315 at the opposite sides of the gate electrode 200. A selective ion-implantation of arsenic but only in a predetermined part in the n-channel MOS transistor region 510 is carried out by a self-alignment technique using the gate electrode 200 with the wide walls and the field oxide film 180 as masks at a dose in the range of from $1 \times 10^{15}$ to $1 \times 10^{16}$ atoms/cm$^2$ and an acceleration energy in the range of from 70 to 80 KeV to form the source and drain regions 310 and 320. A selective ion-implantation of fluoroborate but only in a predetermined part in the p-channel MOS transistor region 500 is carried out by a self-alignment technique using the gate electrode 200 with the wide walls and the field oxide film 180 as masks at a dose in the range of from $1 \times 10^{15}$ to $1 \times 10^{16}$ atoms/cm$^2$ and an acceleration energy in the range of from 70 to 80 KeV to form the source and drain regions 330 and 340. A silicon oxide film 350 having a thickness in the range of from 50 to 100 nanometers is deposited on an entire surface of the device by use of a chemical vapor deposition. Contrary to the first embodiment, the silicon oxide films 350 and 195 are not removed to still cover a surface of the n-type epitaxial layer 130 in the homo-junction bipolar transistor region 530. A polysilicon film 210 having a thickness in the range of from 200 to 400 nanometers is deposited on an entire surface of the device by use of a chemical vapor deposition. An ion-implantation of boron into the polysilicon film 210 is carried out at a dose in the range of from $1 \times 10^{15}$ to $1 \times 10^{16}$ atoms/cm$^2$ and an acceleration energy in the range of from 30 to 40 KeV. A silicon nitride film 215 having a thickness in the range of from 200 to 300 nanometers is deposited on an entire surface of the polysilicon film 210 by use of a chemical vapor deposition method. The silicon nitride film 215 and the polysilicon film 210 are sequentially subjected to a selective anisotropic etching such as reactive ion etching for subsequent formations of base plug polysilicon films of the bipolar transistors and formations of openings in the emitter regions thereby the n-type epitaxial layer 130 is partially exposed through the openings in the emitter regions.

A silicon nitride film having a thickness in the range of from 100 to 300 nanometers is deposited on an entire surface of the device. The deposited silicon nitride film is selectively removed by an anisotropic etching to leave the silicon nitride film but only at opposite sides of each of the remaining polysilicon film 210 to form side wall spacers 217 at opposite sides of each of the polysilicon film 210 thereby a device was fabricated as illustrated in FIG. 9A.

The silicon oxide films 350 and 195 underlying the polysilicon film in the homo-junction bipolar transistor region 540 is selectively removed by use of a photoresist 218 as a mask in which an etchant may be a liquid containing fluorine and ammonium fluoride. The exposed silicon nitride film 215 and the exposed silicon nitride side wall spacers 217 remain without removal by the etchant. The Si epitaxial base layer 261 is selectively and epitaxially grown on an exposed surface of the n-type epitaxial layer 130 wherein the Si epitaxial base layer 261 has a thickness in the range of from 30 to 100 nanometers and an impurity boron concentration of $1 \times 10^{18}$ to $1 \times 10^{19}$ atoms/cm$^3$. As described above, an entire surface of the device except for the exposed n-type epitaxial layer 130 in the homo-junction bipolar transistor region 540 has been covered by either the silicon oxide film and the silicon nitride film. Then, the Si epitaxial layer may epitaxially and selectively be grown but only on the epitaxial layer 130 and never grown on the silicon oxide film and the silicon nitride film. The Si epitaxial base layer 261 extends under the polysilicon layer 210 and the side wall spacers 217.

The remaining silicon oxide films 350 and 195 underlying the polysilicon film in the hetero-junction bipolar transistor region 520 is further selectively removed by use of a photoresist 218' as a mask in which an etchant may be a liquid containing fluorine and ammonium fluoride. The exposed silicon nitride film 215 and the exposed silicon nitride side wall spacers 217 remain without removal by the etchant thereby a device is fabricated as illustrated in FIG. 9C. The SiGe epitaxial base layer 230 is selectively and epitaxially grown on an exposed surface of the n-type epitaxial layer 130 wherein the SiGe epitaxial base layer 230 has a thickness in the range of from 30 to 100 nanometers and a Ce content in the range of from 5 to 20%. The growth may be carried out under the conditions of a temperature of 650° C. and flow rates of $Si_2H_6$ and $GeH_4$ are 1 SCCM and 1 SCCM respectively. As described above, an entire surface of the device except for the exposed n-type epitaxial layer 130 in the hetero-junction bipolar transistor region 520 has been covered by either the silicon oxide film and the silicon nitride film. Then, the SiGe epitaxial layer may epitaxially and selectively be grown but only on the epitaxial layer 130 and never grown on the silicon oxide film and the silicon nitride film. The SiGe epitaxial base layer 230 extends under the polysilicon layer 210 and the side wall spacers 217.

The following processes are the same as those of the first embodiment. A polysilicon film 220 having a thickness in the range of from 200 to 300 nanometers on an entire surface of the device by use of a chemical vapor deposition method. An ion-implantation of arsenic into the deposited polysilicon film 220 is carried out at a dose in the range of from $5 \times 10^{15}$ to $1 \times 10^{16}$ atoms/cm$^2$ and an acceleration energy of 70 KeV. The polysilicon film implanted with the impurity is then selectively removed by use of an anisotropic etching to leave the polysilicon film but only in the emitter regions both in the hetero-junction bipolar transistor region 520 and in the homo-junction bipolar transistor region 540 to form the emitter plug electrodes. A high temperature and short time annealing is carried out at a temperature in the range of from 1000° to 1100° C. for 10 to 30 seconds to cause a thermal diffusion of the arsenic into the SiGe epitaxial base region 230 in the hetero-junction bipolar transistor region 520 and into the Si epitaxial base layer 261 in the homo-junction bipolar transistor region 540. The above thermal diffusion results in that the arsenic atoms in the emitter plug polysilicon film 220 move into the base regions 230 and 261 and then reach at a depth in the range of from 0.05 to 0.1 micrometers thereby the emitter regions 225 are formed in an upper region of each of the base regions 230 and 261 in the hetero-junction and homo-junction bipolar transistors. Concurrently, the above annealing process may also cause a further diffusion of the boron atoms from the polysilicon film 210 into the SiGe epitaxial base region 230 in the hetero-junction bipolar transistor region 520 and into the Si epitaxial base layer 261 in the homo-junction bipolar transistor region 540 thereby the graft base regions 240 are formed in the hetero-junction and homo-junction bipolar transistor regions 520 and 540.

An inter-layer insulator made of silicon oxide is deposited on an entire surface of the device by use of a chemical vapor deposition method wherein the inter-layer insulator has a thickness in the range of from 300 to 500 nanometers. The inter-layer insulator is selectively removed by etching to form contact holes for the bipolar transistors and the MOS transistors thereby the device as illustrated in FIG. 8 is fabricated. Thereafter, metal electrodes and wiring layers are formed as required to complete the fabrication processes of the BiCMOS semiconductor device of the first embodiment according to the present invention.

As described above, the Bi-CMOS semiconductor device of the present invention comprises a semiconductor substrate, at least a pair of complementary p-channel and n-channel MOS transistor regions and at least a pair of hetero-junction and homo-junction bipolar transistor regions. The hetero-junction bipolar transistor has a SiGe epitaxial base layer, while the homo-junction bipolar transistor transistor has either a silicon intrinsic base layer or a silicon epitaxial base layer. The hetero-junction bipolar transistor is operated in a low collector current region less than a critical collector current value at which the hetero-junction bipolar transistor has the maximum value of the cutoff frequency, while the homo-junction bipolar transistor is operated in a high collector current region more than a critical collector current value at which the homo-junction bipolar transistor has the maximum value of the cutoff frequency. The hetero-junction bipolar transistor may be used for the emitter coupled logic circuit (ECL circuit) or NTL circuit. The homo-junction bipolar transistor is suitable for driving a load capacitance connected to an output terminal of the BiCMOS circuit.

From the above descriptions, it could be understood that when the BiCMOS circuit is provided at an adjacent portion to the emitter coupled logic circuit as illustrated in FIGS. 10 and 11, the hetero-junction bipolar transistor is used for driving the load capacitance connective to the BiCMOS circuit and the homo-junction bipolar transistor is used for the emitter coupled logic circuit. In the ECL gate logic circuit, the hetero-junction bipolar transistor has an operation speed higher than that of the homo-junction bipolar transistor by 15 to 20 psec. By contrast, in driving the load capacitance connected to the output terminal of the BiCMOS circuit, the homo-junction bipolar transistor has a driving ability higher than that of the hetero-junction bipolar transistor by 1.5 to 2 times.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the sprit and scope of the invention.

What is claimed is:

1. A BiCMOS semiconductor device comprising:

a silicon substrate;

a pair of p-channel and n-channel MOS field effect transistors formed on said silicon substrate;

a hetero-junction bipolar transistor formed on said silicon substrate, said hetero-junction bipolar transistor including a collector region of an impurity doped epitaxial layer formed on an impurity doped buried layer on said silicon substrate, an epitaxial silicon germanium base layer formed on said collector region, said epitaxial silicon germanium base layer having a germanium content in the range of from 5 to 20% and an emitter region formed in an upper region of said base layer; and a homo-junction bipolar transistor formed on said silicon substrate, said homo-junction bipolar transistor including a collector region of an impurity doped epitaxial layer formed on said buried layer, a silicon base layer comprising an epitaxial silicon layer having a thickness in the range of from 30 to 100 nanometers, and an emitter region formed in an upper region of said base layer.

2. The device as claimed in claim 1, wherein said epitaxial silicon germanium base layer has a thickness in the range of from 30 to 100 nanometers.

3. The device as claimed in claim 1, wherein said epitaxial silicon germanium base layer has a concentration of boron in the range of from $1\times10^{18}$ to $1\times10^{19}$ atoms/cm$^3$.

4. The device as claimed in claim 1, wherein said base layer of said homo-junction bipolar transistor comprises an intrinsic silicon base layer.

5. The device as claimed in claim 1, wherein said hetero-junction bipolar transistor is operated in a low collector current region less than a critical collector current value at which said hetero-junction bipolar transistor has the maximum value of a cutoff frequency thereof.

6. The device as claimed in claim 5, wherein said hetero-junction bipolar transistor is connected to an external device having a small load capacitance.

7. The device as claimed in claim 6, wherein said external device is an emitter coupled logic circuit.

8. The device as claimed in claim 1, wherein said homo-junction bipolar transistor is operated in a high collector current region more than a critical collector current value at which said homo-junction bipolar transistor has the maximum value of a cutoff frequency thereof.

* * * * *